United States Patent
Nair

(10) Patent No.: US 7,348,810 B1
(45) Date of Patent: Mar. 25, 2008

(54) PUSH PULL HIGH-SWING CAPABLE DIFFERENTIAL SIGNALING CIRCUITS

(76) Inventor: Rajendran Nair, 3838 E. Encinas Ave., Gilbert, AZ (US) 85234

( * ) Notice: Subject to any disclaimer, the term of this patent is extended or adjusted under 35 U.S.C. 154(b) by 21 days.

(21) Appl. No.: 11/588,156

(22) Filed: Oct. 27, 2006

(51) Int. Cl.
*H03B 1/00* (2006.01)

(52) U.S. Cl. .................. 327/108; 327/112; 326/83

(58) Field of Classification Search .......... 327/108, 327/112; 326/83, 86
See application file for complete search history.

(56) References Cited

U.S. PATENT DOCUMENTS

| | | | | |
|---|---|---|---|---|
| 6,111,431 | A * | 8/2000 | Estrada | 326/83 |
| 6,600,346 | B1 * | 7/2003 | Macaluso | 327/108 |
| 7,012,450 | B1 * | 3/2006 | Oner et al. | 326/86 |
| 7,030,665 | B2 * | 4/2006 | Takeuchi | 327/112 |
| 7,196,556 | B1 * | 3/2007 | Nguyen et al. | 327/108 |
| 7,202,710 | B2 * | 4/2007 | Carvajal et al. | 327/108 |
| 7,236,018 | B1 * | 6/2007 | Wang et al. | 327/108 |

* cited by examiner

*Primary Examiner*—N. Drew Richards
*Assistant Examiner*—Hai L. Nguyen

(57) ABSTRACT

A novel push-pull differential signaling circuit architecture exceptionally suited for 2-wire transceiver implementations is disclosed. The invention Class-B differential signaling (CBDS) architecture fully utilizes equivalent current sources connecting from the positive power rail and to the negative power rail to generate a 'true-differential' signal in a differential interconnect pair. By adopting a 'Class B' or push-pull drive structure, the invention architecture maximizes power efficiency, improving upon traditional differential signaling implementations by a factor of 2 or more. A novel combination of a bias circuit and the Class B output drive circuit ensures that the push and pull currents are very closely matched over fabrication process, voltage and temperature. The current mode operation and bi-lateral nature of the output driver ensures that there are no current spikes in the power supply connecting to the invention circuits, thereby minimizing on-chip decoupling capacitance requirements. Due to the symmetry in the push and pull current action, EM emissions from the external interconnect pair is greatly reduced, allowing much higher current drive (14 mA) and correspondingly higher voltage swings.

16 Claims, 3 Drawing Sheets

CBDS circuit architecture with Transmit Emphasis (EMBODIMENT)

Diagrams
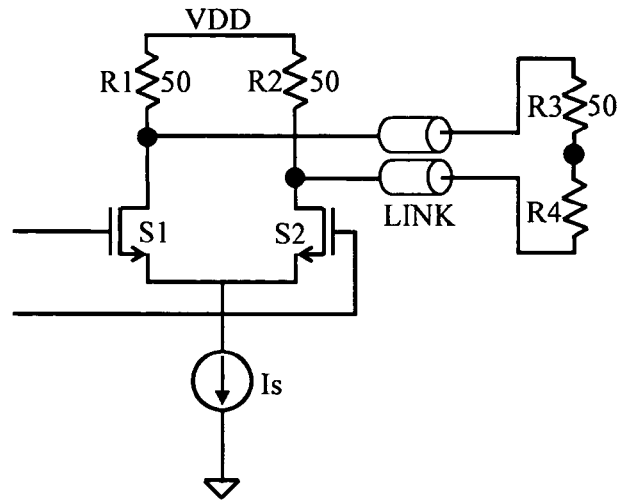
Figure 1: Prior Art LVDS driver and termination
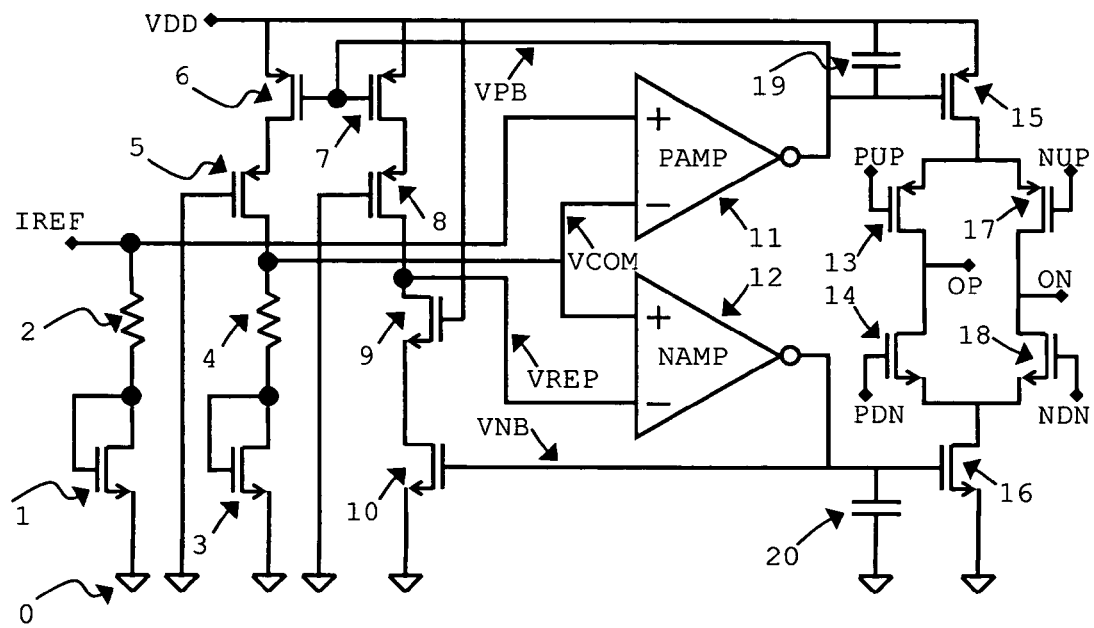
Figure 2: Class-B Differential Signaling Architecture (INVENTION)

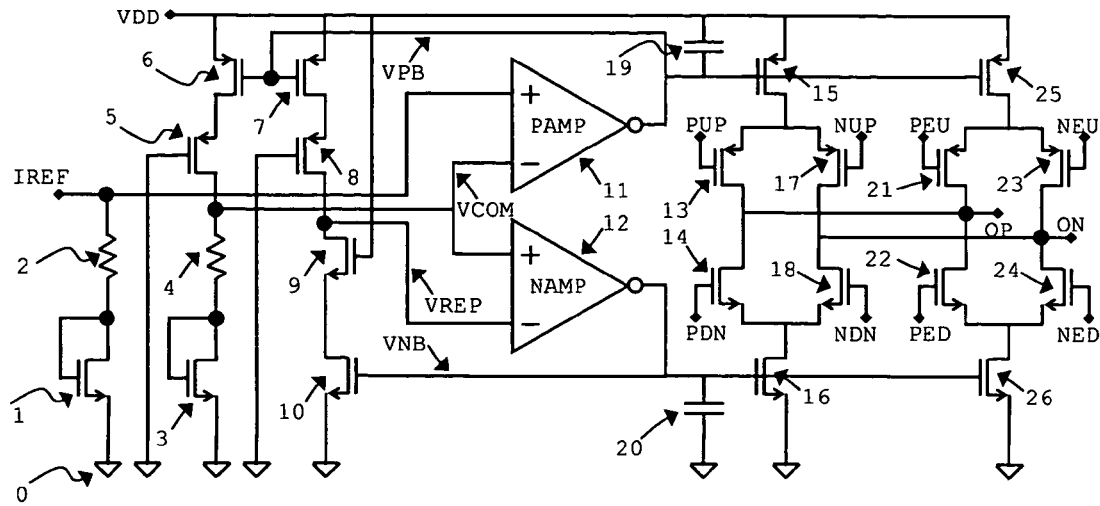
Figure 3: CBDS circuit architecture with Transmit Emphasis (EMBODIMENT)
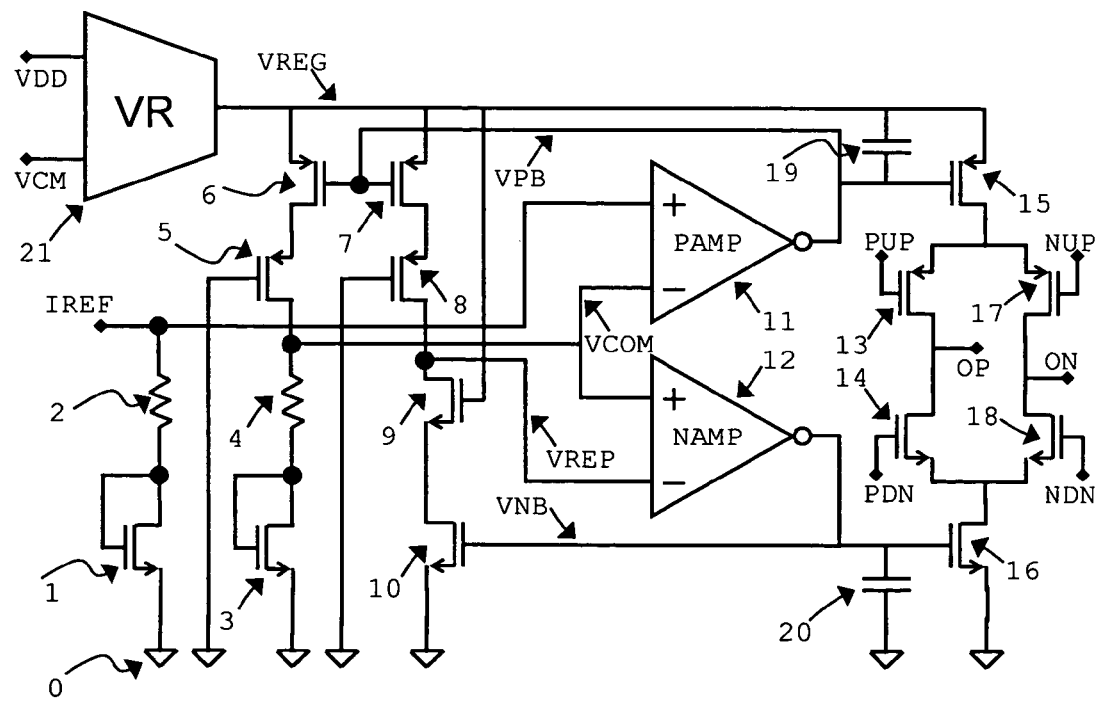
Figure 4: Alternate invention embodiment

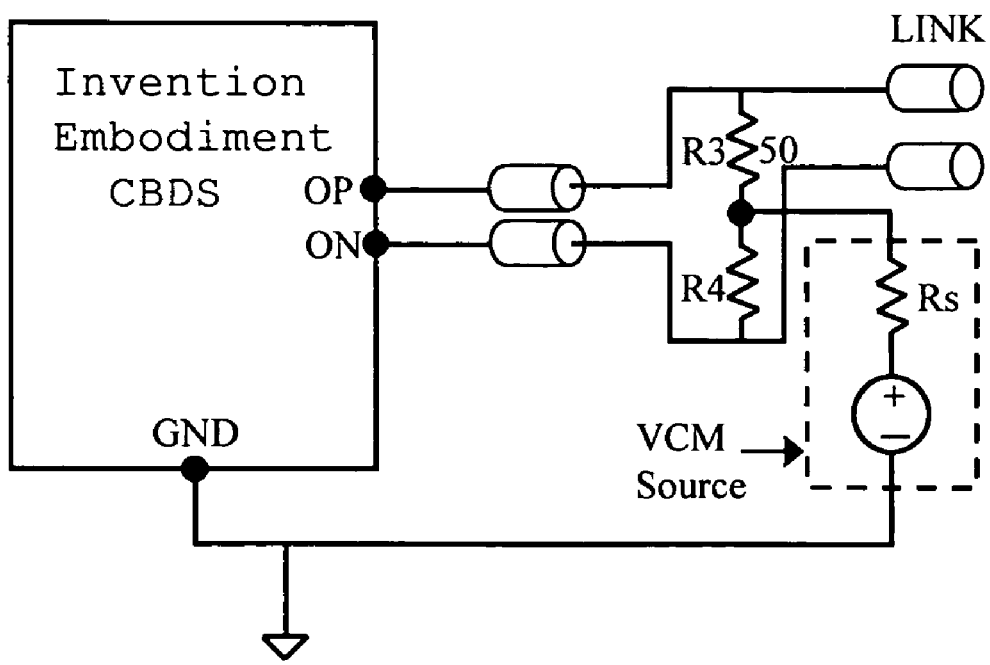
Figure 5: Termination and VCM connectivity

US 7,348,810 B1

PUSH PULL HIGH-SWING CAPABLE DIFFERENTIAL SIGNALING CIRCUITS

TECHNICAL FIELD OF THE INVENTION

Embodiments of the invention relate to electronic circuitry commonly employed to transmit data and binary signals over lengths of interconnect to other electronic circuits, devices and systems. Such circuitry falls under the category of Data Communication Circuits.

BACKGROUND & PRIOR ART

Low Voltage Differential Signaling (LVDS) is ubiquitous in the art. The popularity of this signaling technique arose in part from the expectation of substantially reduced power consumption because of the low (~400 mV) swing on the lines as well as the differential nature of the signals that enabled accurate recognition despite static or dynamic variations in ground or supply voltages between the transmitting and receiving systems. Low signal swing also permits faster signal transitions, enabling higher rates of data transmission. Additionally, the differential and low-swing nature of signals also minimizes electromagnetic interference (EMI) and emissions from the signaling interconnect. Hence LVDS became the signaling method of choice for relatively long links such as high-speed links between peripheral components of a computing system (USB), networking interconnect infrastructure installed in buildings (Ethernet) etc.

Whereas the low voltage swing of 400 mV does lead to savings in power, this is not entirely beneficial because of circuit overhead, particularly at low data rates, or when interconnect is very long or lossy at the required transmission data rate. For example, to bring about a 400 mV swing across a typical 100 Ohm termination, a current of 4 mA is required through the differential interconnect pair, and in order to be able to provide such a current, typical circuits employed for LVDS communication need to operate with static currents substantially higher than this signal current requirement. This is because typical LVDS driver circuits are very similar to simple differential amplifier stages that comprise of two current-steering devices operating from a fixed current source. In combination with terminating impedances at the transmit-end to minimize signal integrity issues, a minimum of 4 times the 4 mA current, or 16 mA needs to be used as the static current source biasing the differential current-steering driver. This is akin to the 25% or lower efficiency of Class-A electronic amplifiers.

Similarly, interconnect link loss increases greatly as the data rate increases or the length of the interconnect increases. As losses increase, the available signal amplitude at the far end of the transmission link is reduced correspondingly. At multiple Giga-bits-per-second (Gbps) data rates, losses along cables may be as high as 1 dB/m, and over a 30 m length of cable as may be desired for certain multi-media or other high-data-bandwidth applications, signals may be attenuated by a factor of 31.6 or more. This would amount of signal amplitude of about 12.5 mV at the far end for a transmitted signal amplitude of 400 mV, greatly stressing the capability of receiver amplifiers in discriminating this signal from noise. Additionally, inter-symbol-interference (ISI) due to the dispersive nature of lossy interconnect degrades signal symbols further, making them indistinguishable. In such instances, therefore, low swing signals are not advantageous, and a technique for high signal swing that retains advantages of differential signaling is desired. This is also particularly true of transceiver-to-transceiver signaling link implementations where termination impedances at both ends of the link further attenuate signals, and also in instances where passive equalization techniques are employed resulting in additional signal attenuation.

INVENTION SUMMARY

The invention differential signaling (CBDS) architecture fully utilizes equivalent current sources connecting from the positive power rail and to the negative power rail to generate a 'true-differential' signal in a differential interconnect pair. By adopting a 'Class B' or push-pull drive structure, the invention architecture also maximizes power efficiency, improving upon traditional differential signaling implementations by a factor of 2 or more. A novel combination of a bias circuit and the Class B output drive circuit ensures that the push and pull currents are very closely matched over fabrication process, voltage and temperature. The current mode operation and bi-lateral nature of the output driver ensures that there are no current spikes in the power supply connecting to the invention circuits, thereby minimizing on-chip decoupling capacitance requirements. Due to the symmetry in the push and pull currents, radiation in the external interconnect pair is greatly reduced, allowing higher current drive (14 mA) and correspondingly higher voltage swings, as contrasted with LVDS implementations designed for 3.5 mA drive.

BRIEF DESCRIPTION OF THE FIGURES

FIG. 1 illustrates a typical prior art LVDS driver and termination circuit architecture.

FIG. 2 is an illustration of the invention Class-B Differential Signaling circuit architecture.

FIG. 3 is a alternate embodiment of the invention architecture including transmitter emphasis.

FIG. 4 is an embodiment of the invention with output common-mode voltage control.

FIG. 5 is an embodiment illustrating external termination and common-mode voltage control.

DETAILED DESCRIPTION

A prior art embodiment of a differential signaling output driver and termination architecture is illustrated in FIG. 1. In this original LVDS driver architecture, a primary current source of a simple differential amplifier circuit pulls current from the local supply through load devices that are typically matched with the impedance of the interconnect elements connecting to the junctions of the load devices and the current-steering switches. When switch S1 turns 'off' and S2 turns 'on' driven by input signals to the gates of these devices, the full current $I_s$ divides between R2 and R1+R3+R4, thereby sourcing current in one direction through the link far-end terminating resistors R3 and R4. Conversely, when S1 turns 'on' and S2 'off', current flows in R1 and R2+R4+R3, and while the current through R4 and R3 is the same as in the previous state, the direction is reversed. This provides the differential nature of signal development in the far-end terminating resistors, controlled by input signals to the driver circuit.

It will be evident to one skilled in the art that there are significant disadvantages to this driver architecture. Firstly, since the current source current $I_s$ divides between one 50 ohm resistance and another approximately 3 times the resistance value, a substantially smaller current flows along the greater resistance pathway. Since this is the pathway that includes the differential interconnect elements, a multiple value of current is required for the current source so as to transmit the necessary current through the differential interconnect. The power transfer efficiency of this driver architecture is therefore quite low. Additionally, the output common-mode voltage (the voltage at which differential signal crossovers occur), or the average value of the output differential signal is dependent upon the current source current as well as supply voltage VDD.

Nevertheless, the prior art circuit architecture for differential signaling has significant advantages. Noise on the supply voltage VDD, for example, is coupled in more or less an equivalent manner to both wires of the differential interconnect, rendering such noise 'common-mode', and therefore mitigating its effect on the signal at the far-end of the link through the high common-mode rejection ratio (CMRR) of the receiving circuit. With sufficient decoupling capacitance of the necessary bandwidth added between ground and VDD, noise on ground is also rendered common-mode in the differential interconnect. Additionally, the simple driver architecture is 'self-terminated', through load resistances R1 and R2 that are matched to the characteristic impedance of each wire in the wire pair, eliminating the need for any external termination impedances and permitting on-chip impedance calibration to match the differential interconnect.

As systems integrate more and more components, and chips integrate more and more devices in accordance with industry trends, power consumption is becoming a principle concern for any system-on-chip (SoC) implementation. Combined with greater data throughput needs as in high-definition multi-media applications, it is becoming increasingly important that a low-power, high-efficiency signaling architecture be used for chip-to-chip and system-to-system communication.

The invention architecture illustrated in FIG. 2 fills exactly such a need. A Class-B or push-pull amplifier structure is adopted for the output driver, allowing the entire current from identical current sources connecting to the power supply node VDD and the ground node (0) to be directed into and out of the differential output pins OP and ON. For high-speed applications, this ability to channel the full current to output pins helps speed up rise and fall times significantly, while static power consumption is kept low by only drawing as much current as is necessary from the power supply. Additionally, the invention differential signaling architecture allows for true-differential termination by inserting a terminating resistance matched to the differential impedance of the interconnect link between the output terminals. In most applications, such a differential termination is split into two equal resistance elements, and the junction of the two resistances is provided with a common-mode voltage source with a wideband frequency response that determines the common-mode voltage of the driven signal and minimizes differential noise.

Whereas the external termination impedance necessary in the invention signaling architecture does divert the currents driven out of pins OP and ON, this is an essential aspect of a transceiver link, making the invention architecture optimally suited for such an application.

Critical to high performance in any embodiment of the invention architecture is the novel matched bias circuit structure formed by devices 1 through 12 in FIG. 2. These devices form a bias circuit that accurately transforms an input reference current into bias voltages referenced to VDD and ground (node 0) that generate multiples of this input reference current in PFET and NFET current-source devices of the output driver.

Devices 1 and 2 receive an input reference current provided into node (pin) IREF. In the embodiment shown in FIG. 2, this is a positive current flowing into IREF and through 2, 1 into ground, which is designated as node 0 in the figure. In an embodiment of the invention, this current into node IREF is 150 uA. Devices 3, 4, 5 and 6 form a ratioed first matched current path stack that multiplies the input reference current into node IREF by a fixed factor. This is accomplished, for example, by making device 3 exactly 7 times larger in width (and therefore carrying 7 times higher current under exactly the same operating voltage conditions) than device 1, and making device 2 exactly 7 times larger in resistance value as device 4, thereby rendering the voltage drop across device 2 the same as that across device 4 carrying 7 times higher current. Devices 5 and 6 of the first matched stack are chosen to be fractions of devices 13 and 15 (of the output driver formed by devices 13 to 18) respectively, so as to multiply and mirror the current flowing through device 6 into device 15. In one embodiment, this multiplier is 10, and device 6 is therefore one-tenth the width of device 15. A controlling, inverting amplifier named PAMP in FIG. 2 compares voltages at nodes IREF and VCOM and drives the gate node of device 6 so as to create a current flow in the first matched stack. In the embodiment with an input reference current of 150 uA and device ratio of the first matched current path to the input reference current path of 7, the current flowing through the first matched current path is 1.05 mA.

A second matched current path stack formed by devices 7 through 10 in FIG. 2 mirrors the current flowing in the first matched current path stack through devices 7 and 8 that are exactly equivalent to devices 6 and 5 respectively. The gate nodes of devices 5 and 8 are connected, in this embodiment, to ground, rendering them similar to linear resistors and equivalent in function to switched transistor devices of the output driver formed by devices 13 to 18. The current mirroring through devices 6 and 7 of the first matched stack and the second matched stack is made very accurate through the use of inverting amplifier NAMP that compares the voltages at nodes VCOM and VREP and drives the gate node of device 10 so as to ensure that the operating voltages across the terminals of devices 6 and 7 are identically matched. In the example embodiment, the current flowing through the second matched stack is also ideally 1.05 mA.

Note that device 9 has its gate node connected to the supply node VDD in order to emulate fully switched-on condition of devices 14 or 18 of the output driver, similar to the connection of the gate nodes of devices 5 and 8 to ground, emulating the switched-on condition of devices 13 or 17 of the output driver. Both the first matched current stack and the second matched current stack therefore match output driver functionality in an electrical sense. Devices 10 and 9 are also sized such that they are related to output driver devices 16 and 14 respectively by the same multiplier 10 as in the example embodiment.

The output node of amplifier NAMP that drives the gate node of device 10 of the invention embodiment is named VNB and similarly, the output node of amplifier PAMP that drives the gate node of device 6 is named VPB. VNB and VPB form bias voltages to be applied to the NFET current source (device 16) and the PFET current source (device 15) of the output driver. Because device 16 is 10 times larger (by width) as device 10, and device 15 is similarly larger than device 6 in the example embodiment, and since the electrical potentials for device 16 are well matched with those for device 10, and the electrical potentials for device 15 and matched with those of device 6, the two output driver current sources carry exactly 10 times the current carried by the first matched path and the second matched path. They therefore carry currents of 10.5 mA each, with device 16 pulling 10.5 mA to ground, and device 15 sourcing 10.5 mA from VDD.

Key to ensuring equivalent source and sink currents in the invention circuit architecture is the matching of devices 6, 7 and 15 together, and 10, 16 together. While circuit structure and electrical operating conditions are well-matched by the functionality inherent in the invention, it is critically important that the sets of matched devices are designed with all physical layout matching rules applicable such as common-centroiding, intermingling of segments of devices, absence of mirroring of segments, identical neighboring topography etc. so as to minimize any device parameter mismatches arising out of fabrication processing or component aging.

Another important consideration in the design of the circuits implementing an embodiment of the invention is the nature of the input devices employed for inverting amplifiers PAMP and NAMP in FIG. 2. In an example embodiment illustrated in FIG. 2, amplifier PAMP compares a ground referenced voltage at node IREF with a similarly referenced voltage at node VCOM. Input devices that are best suited for this comparison, when CMOS devices are employed to construct amplifiers PAMP and NAMP, are NFET devices. Similarly, amplifier NAMP compares a voltage derived with reference to VDD with VCOMP and PFET input devices are preferred in a CMOS implementation.

It will be evident to one skilled in the art that the input reference current path may be connected to the positive power rail or VDD, with a PFET device used, appropriately connected, instead of the NFET as shown in the invention embodiment of FIG. 2. In such a transformation, the reference current will be a negative current, pulled out of the IREF node, and the first matched current path stack will develop a bias for the 'sink' current or bias voltage VNB, and the second matched current path stack will develop a bias for the 'source' current or bias voltage VPB. It will also be evident to those skilled in the art that this alternate embodiment may be combined with the example embodiment shown in FIG. 2 by paralleling source and sink current sources developed in each embodiment to implement a class-B driver circuit with better source and sink current matching.

FIG. 3 illustrates an embodiment with a parallel output driver employed for output emphasis. Both pre- and de-emphasis can be accomplished through appropriate control of the equalization switches' gate nodes PEU, NEU, PED and NED in the figure. In an example embodiment, device 25 is one-third the width of device 15, and device 26 is similarly one-third the width of device 16. Both devices 15 and 16 conduct 10.5 mA of current, as source and sink currents respectively, and therefore devices 25 and 26 will conduct 3.5 mA each as source and sink currents. In a de-emphasis implementation, switches 21 through 24 are controlled such that the source and sink currents add up for a data symbol transition (between 'true' and 'false') and subtract when a symbol is the same as its predecessor. In such an operating mode, the peak source and sink currents will be 14 mA, while they drop to 7 mA for symbol sequences of 2 or more of the same type. A pre-emphasis implementation may apply either or both sink and source current modulation through the parallel equalization branch consisting of devices 21 through 26 to the currents provided by the main output driver branch consisting of devices 13 through 16 of FIG. 3.

A vulnerability in the Class-B output driver architecture is that noise on the power supply nodes that is differential may appear as differential noise in the output interconnect signals as well. For example, with reference to FIG. 2, noise on VDD may appear on the output line that is pulled high, while the same noise may not appear on the complementary signal line that is pulled low. This effect can be mitigated through wideband decoupling capacitance inclusion between the local VDD and ground nodes of the invention architecture. Additionally, it may be effectively addressed through the use of a local voltage regulator as illustrated in the embodiment in FIG. 4. A wideband local regulator can ensure that there is little or no noise that is differential between the VDD and ground nodes connecting to the output driver and thus prevent differential noise coupling into the output signal. Additionally, a regulator provides the ability to modulate the output common-mode voltage as desired within the chip integrating the invention, thus avoiding an external common-mode voltage source.

A preferred embodiment of the invention uses external termination resistors and an external common-mode voltage source as illustrated in FIG. 5. Negative consequences of mismatches in the source and sink currents of the invention architecture may be mitigated by providing a VCM (common-mode voltage) source with sufficiently low source impedance Rs. Any mismatch in the source and sink currents tends to change the voltage at the junction of the two termination resistances R3 and R4 when the transmitted symbol changes. Low source impedance for the VCM source connecting to this junction counteracts this effect and absorbs the mismatch in the source and sink currents, rendering the forward and return currents flowing in the interconnect identical and opposite in polarity. This further mitigates radiation and emissions from the differential interconnect.

It may be evident to one skilled in the art that termination resistors may be avoided by designing the operating supply voltage and output currents such that at full swing, where the voltages at nodes OP and ON approach VDD or VSS, the switch transistor devices as well as the current source devices in the embodiment shown in FIG. 1 will be in their linear region of operation, and will thus present finite output impedances. The sum of these finite resistance values will thus present terminating impedances on each of the differential outputs. The output driver transistor devices may therefore be designed such that under the described maximum excursions, the terminating impedance presented as the sum of the finite output impedances of each of the output current paths matches that of the interconnect link wires, thus avoiding external termination resistors, lower operating currents and enabling low power at high swings.

With reference to FIG. 1, capacitor devices 19 and 20 also assist in maintaining the source and sink currents constant in the presence of noise in the supply rails. These capacitors as well as high-bandwidth decoupling capacitors between VDD and ground (not shown in the figures) are critical to ensuring high signal-to-noise ratio (SNR) in the output of the invention architecture.

Although specific embodiments are illustrated and described herein, any circuit arrangement configured to achieve the same purposes and advantages may be substituted in place of the specific embodiments disclosed. This disclosure is intended to cover any and all adaptations or variations of the embodiments of the invention provided herein. All the descriptions provided in the specification have been made in an illustrative sense and should in no manner be interpreted in any restrictive sense. The scope, of various embodiments of the invention whether described or not, includes any other applications in which the structures, concepts and methods of the invention may be applied. The scope of the various embodiments of the invention should therefore be determined with reference to the appended claims, along with the full range of equivalents to which such claims are entitled. Similarly, the abstract of this disclosure, provided in compliance with 37 CFR §1.72(b), is submitted with the understanding that it will not be interpreted to be limiting the scope or meaning of the claims made herein. While various concepts and methods of the invention are grouped together into a single 'best-mode' implementation in the detailed description, it should be appreciated that inventive subject matter lies in less than all features of any disclosed embodiment, and as the claims incorporated herein indicate, each claim is to viewed as standing on it's own as a preferred embodiment of the invention.

REFERENCES

1. International Engineering Consortium tutorial on 'Low voltage differential signaling (LVDS)' 2005 http://www.iec.org/online/tutorials/low_voltage/
2. Telecommunications Industries Association/Electronics Industries Association signaling standard TIA 644-A, "Electrical characteristics of low voltage differential signaling . . . ", http://ftp.tiaonline.org/tr-30/tr302/Public/2000%20Contributions/20005017.pdf

PRIOR ART

1. Anthony Yap Wong, U.S. Pat. No. 6,288,581, Low-voltage differential-signaling output buffer with pre-emphasis
2. Lin-Kai Bu, U.S. Pat. No. 6,873,660, High bandwidth low power differential transmitter
3. William J. Daily et. al, U.S. Pat. No. 6,426,656, High speed, low-power inter-chip transmission system
4. Roger Dale Emeigh et. al, U.S. Pat. No. 5,767,698, High speed differential output driver with common reference
5. Chak Cheung Edward Ho, U.S. Pat. No. 6,118,438, Low comment mode impedence differential driver and applications thereof
6. Julio Ricardo Estrada, U.S. Pat. No. 6,111,431, LVDS driver for backplane applications
7. Thaddeus John Gabara, U.S. Pat. No. 5,977,796, Low voltage differential swing interconnect buffer circuit

What is claimed is:

1. An integrated circuit apparatus for differential signal output, comprising:
   an output driver circuit, providing positive and negative currents to differential output pins, which currents are derived from equivalent current source transistors connecting to positive and negative supply rails;
   a reference circuit branch, receiving an input reference current and developing a first reference voltage;
   a first matched circuit stack, between the positive and negative supply rails, containing a first branch that is a ratioed replica of the reference circuit branch in series with a second branch that is a ratioed replica of a first current path of the output driver, the second branch containing a controlled current source transistor, with the first matched circuit stack developing a second reference voltage at the junction of its two branches;
   a first differential amplifier that develops as an output a gain-multiplied value of the difference between the first reference voltage and the second reference voltage, this output connecting to the control input of the controlled current source transistor of the second branch of the first matched circuit stack and to the control input of the current source transistor of the first current path of the output driver;
   a second matched circuit stack, between the positive and negative supply rails, containing a third branch that is a ratioed replica of a second current path of the output driver in series with a fourth branch that is a ratioed replica of the first current path of the output driver, the fourth branch matched exactly with the second branch of the first matched circuit stack and containing a current source transistor with its control input connecting to the output of the first differential amplifier, the third branch containing a controlled current source transistor, with the second matched circuit stack developing a third reference voltage at the junction of its two branches;
   a second differential amplifier that develops as an output a gain-multiplied value of the difference between the second reference voltage and the third reference voltage, this output connecting to the control input of the controlled current source transistor of the third branch of the second matched circuit stack and to the control input of the current source transistor of the second current path of the output driver.

2. The apparatus of claim 1 employed to provide differential output currents substantially higher than 3.5 mA.

3. The apparatus of claim 1 employed to provide differential voltage swings substantially higher than 350 mV into a terminated differential transceiver link.

4. The apparatus of claim 1 employed to provide voltage swings of as much as one-half the available power supply voltage into a terminated differential transceiver link.

5. The apparatus of claim 1 employed to provide voltage swings equal to or around 350 mV into a terminated differential transmission line in accordance with LVDS signaling standards.

6. The apparatus of claim 1 fabricated in a complementary metal-oxide semiconductor process where PFET and NFET transistors are employed as current source and reference voltage generation devices.

7. The apparatus of claim 1 fabricated in a CMOS process where field-effect transistors biased appropriately are employed as resistance elements.

8. The apparatus of claim 1 where the second reference voltage developed is very nearly the same as the external common-mode voltage applied to the junction of two differential terminating resistors.

9. The apparatus of claim 1 where the output driver current paths present terminating impedance values matching the characteristic impedances of the link wires.

10. The apparatus of claim 1 with a parallel, ratioed output driver employed for transmit equalization.

11. The apparatus of claim 1 with a wideband voltage regulator employed to regulate the power supply voltage.

12. The apparatus of claim 1 with a wideband voltage regulator regulating the power supply voltage employed to program the output common-mode voltage.

13. The apparatus of claim 1 with wideband supply decoupling capacitance rendering noise on the power supplies common-mode.

14. The apparatus of claim 1 connecting to a differential transmission link employing termination resistors, with a common-mode voltage source of low source impedance connecting to the junction of the termination resistors employed to absorb mismatches in the differential output currents provided.

15. Electronic systems comprised of various integrated and discrete electronic circuits and devices that employ the apparatus of claim 1 in any embodiment.

16. Interconnect systems comprised of various integrated and discrete electronic circuits, devices and interconnecting materials and elements that employ the apparatus of claim 1 in any embodiment.

* * * * *